(12) United States Patent
Rodriguez et al.

(10) Patent No.: US 6,515,858 B2
(45) Date of Patent: Feb. 4, 2003

(54) THERMAL DISTRIBUTION SYSTEM

(75) Inventors: Edward T. Rodriguez, Winchester, MA (US); Gary R. Fuchs, Princeton, MA (US)

(73) Assignee: Unipower Corporation, Coral Springs, FL (US)

( * ) Notice: Subject to any disclaimer, the term of this patent is extended or adjusted under 35 U.S.C. 154(b) by 0 days.

(21) Appl. No.: 09/875,524

(22) Filed: Jun. 6, 2001

(65) Prior Publication Data

US 2002/0006027 A1 Jan. 17, 2002

Related U.S. Application Data

(60) Provisional application No. 60/209,673, filed on Jun. 6, 2000.

(51) Int. Cl.[7] ................................................. H05U 7/20
(52) U.S. Cl. ...................... 361/695; 361/690; 361/694; 361/719; 174/16.1; 174/16.3; 165/80.3; 165/122; 165/104.33; 454/184
(58) Field of Search ............................... 361/690–695, 361/697, 704, 707, 709, 717–721; 174/16.1, 16.3; 165/80.3, 104.33, 185; 363/141

(56) References Cited

U.S. PATENT DOCUMENTS

| | | | | |
|---|---|---|---|---|
| 4,872,102 A | * | 10/1989 | Getter | ........................ 363/141 |
| 5,172,756 A | * | 12/1992 | Jayamanne et al. | ........ 165/80.3 |
| 5,909,358 A | * | 6/1999 | Bradt | ......................... 361/707 |
| 5,936,839 A | * | 8/1999 | Saito | ........................... 361/707 |
| 5,946,188 A | * | 8/1999 | Rochel et al. | .............. 361/690 |
| 6,046,921 A | | 4/2000 | Tracewell et al. | |
| 6,081,423 A | | 6/2000 | Griffin | |
| 6,198,642 B1 | * | 3/2001 | Kociecki | ...................... 363/37 |
| 6,202,700 B1 | * | 3/2001 | Tzinares et al. | ............ 361/719 |
| 6,262,906 B1 | * | 7/2001 | Salzmann et al. | ............ 363/37 |
| 6,310,776 B1 | * | 10/2001 | Byrne et al. | ................. 361/707 |
| 6,326,761 B1 | * | 12/2001 | Tareilus | ...................... 318/722 |
| 6,330,160 B1 | * | 12/2001 | Ayres et al. | ................. 361/707 |

\* cited by examiner

*Primary Examiner*—Boris Chervinsky
(74) *Attorney, Agent, or Firm*—Cesari and McKenna, LLP; Edwin H. Paul, Esq.

(57) ABSTRACT

The present invention relates to high density electronic power supplies and more particularly switching power supplies employing a metallic enclosure and integral cooling means. The configuration employs an array of thermally conductive metal bars to optimally distribute heat from a number of dissipative elements to a thermally conductive metal element that has substantial surface area within an internally generated air stream. The thermally conductive metal element may be the metal enclosure that also acts as a heat sink or fins, both of which provide substantial surface area to the air stream.

5 Claims, 14 Drawing Sheets

THERMAL DISTRIBUTION SYSTEM

CROSS-REFERENCE TO RELATED APPLICATIONS

The present application claims priority from U.S. Provisional Patent Application Ser. No. 60/209,673, which was filed on Jun. 6, 2000, by Edward T. Rodriguez for a Thermal Distribution System and the provisional application is hereby incorporated herein by reference.

BACKGROUND OF THE INVENTION

1. Field of the Invention

The present invention relates to cooling high density electronic power supplies, and more particularly to distributing the thermal load generated by the power supply.

2. Background Information

During the past decade, there has been a trend to provide smaller and lighter computers, especially personal computers and portable types. The electronics industry has been successful in reducing the size of the electronic components, allowing computers to become smaller and lighter. This trend to smaller and lighter devices has extended naturally to power supplies.

The power supply industry has spent considerable effort to meet this trend to reduce the size and weight of power supplies. One result of this effort is a product category known as "high density" DC to DC converters. This type of power supply, as is evident from the title, converts a DC input to one or more DC outputs. U.S. Pat. Nos. 5,206,800; 5,075,821; U.S. Pat. No. RE036098 and U.S. Pat. No. 5,291,382 describe such DC to DC converters. During this past decade, however, the majority of power supplies sold have not been the DC to DC converter type. The majority sold have been "off line" power supplies, sometimes referred to as "mains operated." This type is powered from 110 or 220 VAC mains, or "line" voltages, and outputs one or more DC voltages, and is typified by those sold for personal computers.

With the growth of computer networking, typified by Internet applications and wireless communications, there has been increasing demand for power supplies of greater performance in the same or smaller space. Faster, denser chips and increased functions create a need for more power in a smaller package, i.e., reducing the size of the power supply without reducing its power rating. A major concern of power supply manufacturers is how to remove the heat from these ever smaller supplies. As is well known in the art, higher temperatures reduce lifetimes and can adversely affect performance of electronic components.

This heat removal is the principal barrier to reducing power supply size. In computer/communications products, the power semiconductors remain the principal heat dissipators (heat generators). These semiconductors typically have specified maximum operating and storage junction temperatures above which the devices may be damaged and/or performances of the semiconductors reduced. Lower junction temperatures are usually specified or calculated in practical designs that will ensure proper operation, and the difference from the maximums can be considered as a safety margin for operating the devices. The heat from the semiconductors in these products is ultimately conducted (convected and, to a lesser degree radiated) and absorbed into the some ambient heat sink, e.g. the outside air. How that is done has a significant effect on the size of the power supply. An article by the present inventor, entitled "Cooling a High Density DC-DC Converter Impacts Performance and Reliability," published in PCIM, November 1999, describes the basic thermal issues involved in DC converters and is relevant as well to mains operated power supplies. This article is hereby incorporated herein by reference. The rule is that as the heat density (heat generated in a given volume) increases, heat removal techniques must be concurrently improved and monitored.

In many air cooled power supplies, the transfer of heat from the dissipative elements to the moving air is inefficient, with some of the exhausting air hot and some cool. Often, the distribution and circulation of the cooling air is relatively unsophisticated, with minimum effort given to the dynamics of heat transfer. U.S. Pat. Nos. 6,046,921 and 6,081,423 address some of the thermal management issues discussed in the above referenced article. In each of these patents, power supplies or DC to DC modules are arranged with an air flow axis established along a heat sink to cool the electronics. However, not all the considerations of the article are addressed by these patents.

It is an object of this invention to establish a heat removal configuration which provides a mechanism to establish the lowest thermal resistance from the highly dissipative power semiconductors to the ultimate cooling medium—usually the outside air.

It is another object of this invention to create a mechanism for balancing the thermal load within the unit being cooled to make best use of air flow.

It is a further object of this invention to incorporate a three dimensional alignment of thermal elements that accommodates mechanical system tolerances while maintaining efficient thermal transfer.

Yet another object of the present invention is to spread evenly the heat generated in dissipative semiconductors so as to minimize thermal gradients.

Still another object of the present invention is to position the dissipative power semiconductors relative to their heat sensitivity and the air flow to provide substantially the same thermal safety factor for those power semiconductors.

It is still a further object of this invention to establish a means whereby the thermal and mechanical design allows convenient determination of the operating temperatures of the dissipative power semiconductors.

SUMMARY OF THE INVENTION

The above objects and other advantages are met by the present invention by a power supply system and heat removal process incorporating an integral heat distribution feature that facilitates reducing the size of air flow cooled electronic power supplies.

The present invention is based on and assimilates the following parameters: the intended electrical and mechanical power supply specifications, the available air flow characteristics, the electrical and mechanical specifications of the principal heat generating components, e.g. the power semiconductors, the environment or ambient temperature and the temperatures where the power semiconductors become vulnerable as failure-rates become excessive, and the predictability of that vulnerability.

A formal electrical and mechanical design, coupled with empirical observations, establishes the needed cooling requirements of any particular design. The cooling requirements are met, in part, by drawing in outside air and directing that air flow for the maximum heat removal from the power semiconductors and other dissipative components before exhausting the air.

Those components having the highest heat vulnerability, and therefore the highest cooling needs, are positioned to receive the coolest, most turbulent air flow, usually at the air inlet port. The remaining power semiconductors and other dissipative components are positioned along the air flow path to receive warmer, less turbulent air flow inversely in proportion to their heat vulnerability. That is: the more heat vulnerable the components, the cooler the air and more turbulent the air flow.

Those skilled in the art are able to assign relative heat vulnerability safety margins to the different dissipative components and their packages and appropriately position the components along the air flow path.

An aspect of the present invention is to position the power semiconductors and other dissipative components along the air flow path, thereby constituting a thermal distribution system in which all the dissipative components exhibit substantially equal thermal safety margins.

In a preferred embodiment, the heat sensitive power semiconductors are mounted to multiple low thermal resistance metallic bars that are oriented parallel to the air flow path. The bars attach to the ceiling of a metal enclosure and conduct heat from the power semiconductors to the enclosure which further distributes heat. The bars extend from the ceiling to the printed circuit board (PCB) on which are mounted the power semiconductors in a manner to form air flow channels.

The resulting heat transfer to moving air is related, inter alia, to the combined surface areas of the bars and the enclosure inner surface. The enclosure ceiling thermally links the bars to balance and to prevent excessive heating in any particular bar during certain operating modes.

In another preferred embodiment, the multiple metallic bars extend not to an enclosure ceiling but to a finned heat sink structure below the ceiling of the enclosure. In this arrangement, the finned structure is the principal mechanism for transferring heat to the moving air.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
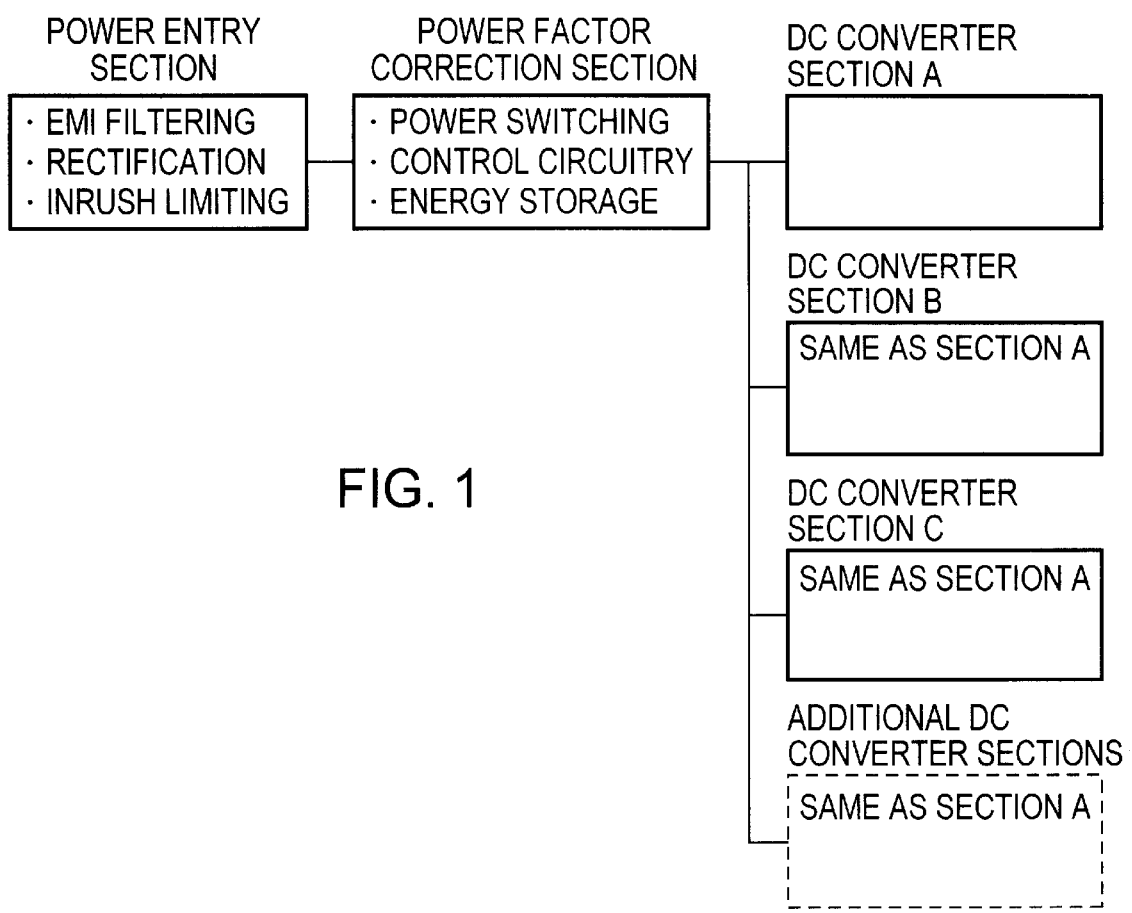
FIG. 1 is a block diagram of considerations need when designing power supplies.

The present invention applies to a number of electronic apparatus categories where heat must be transferred from the heat dissipators to an ultimate ambient-air heat sink via a cooling mechanism. In preferred embodiments of the invention, the apparatuses are power supplies, often switching power supplies. A typical mains operated power supply has several of the following heat dissipative sections, as in FIG. 1: Power Entry; Power Factor Correction; and Power Switching Converter.

Each of the above sections may be further broken down into:

a. Heat generating power semiconductors b. Power magnetics and c. Control circuit consisting of signal-level components.

Preferred embodiments of the present invention are directed towards the power semiconductors, as they typically represent over 80% of the generated heat. Power semiconductors include power transistors and power diodes or rectifiers. The number of such items depends on the number of outputs of the power supply and the particular circuit design. Such individual devices are called "discrete" devices, but some power integrated circuits (ICs) are available wherein certain control circuits are within the same package as the principal dissipative semiconductor. These packaged power ICs are designed to dissipate heat, and therefore heat removal issues must be addressed.

Figure 2:
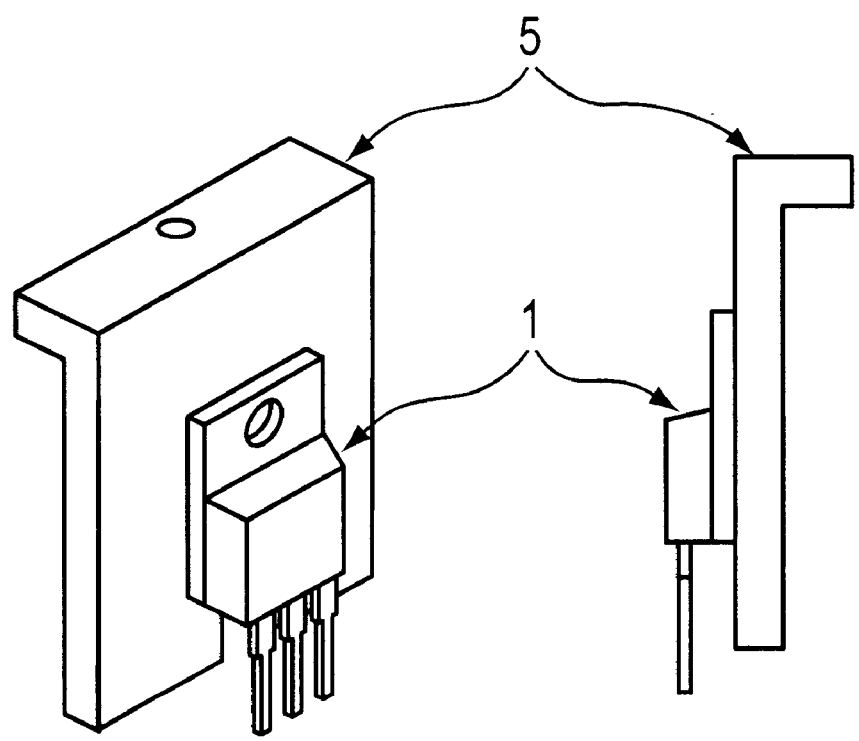
FIG. 2 is an isometric drawing of one dissipative component.
Figure 3:
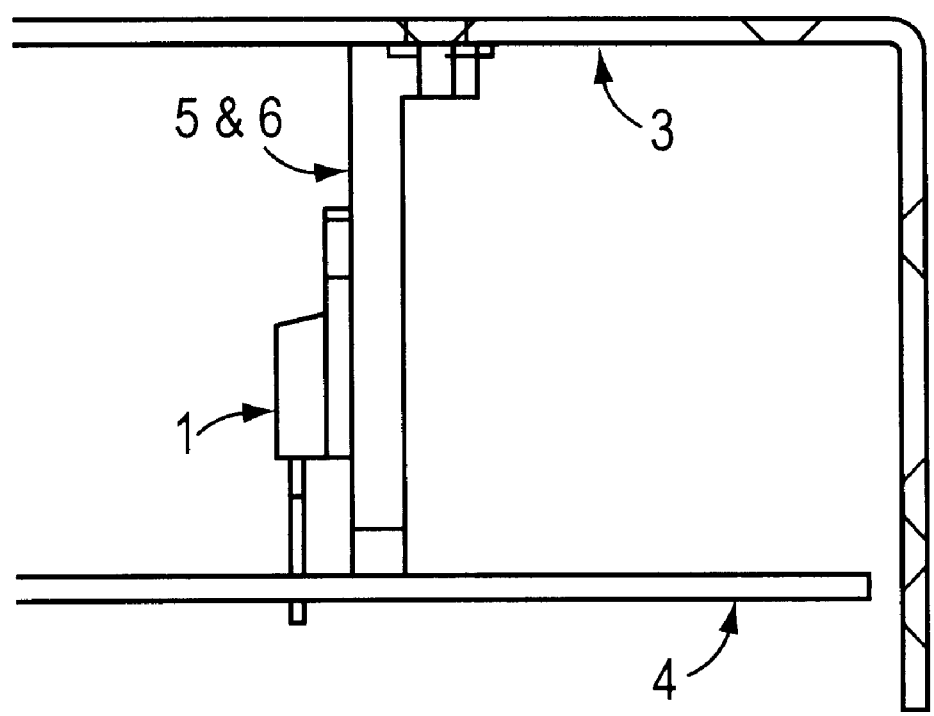
FIG. 3 is and end view of a dissipative component, a heat sink bar, the top and bottom surfaces and an air flow path opening.

FIG. 2 shows a typical power semiconductor 1. These power devices, whether a few or several dozen, are mounted against the flat surface of metallic thermal bars 5 that have upper right angle sections. These upper surfaces of the bars are affixed to the inside surface of an enclosure ceiling 3 as shown in FIG. 3.

Figure 4:
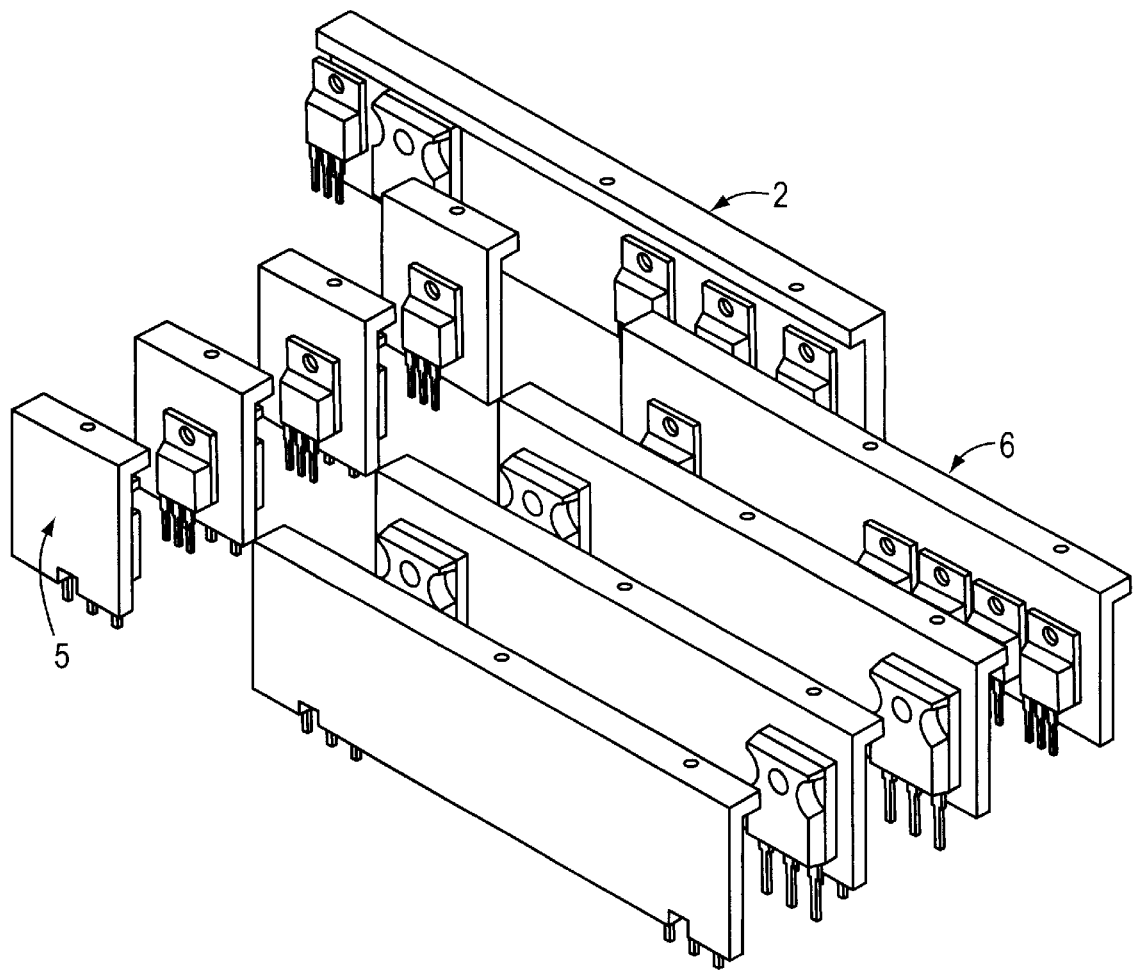
FIG. 4 is an isometric of the arrangement of assembly of heat sink bars and dissipative components, FIG. 5 a side view and a sectioned view of an assembly of a power supply.
Figure 5:
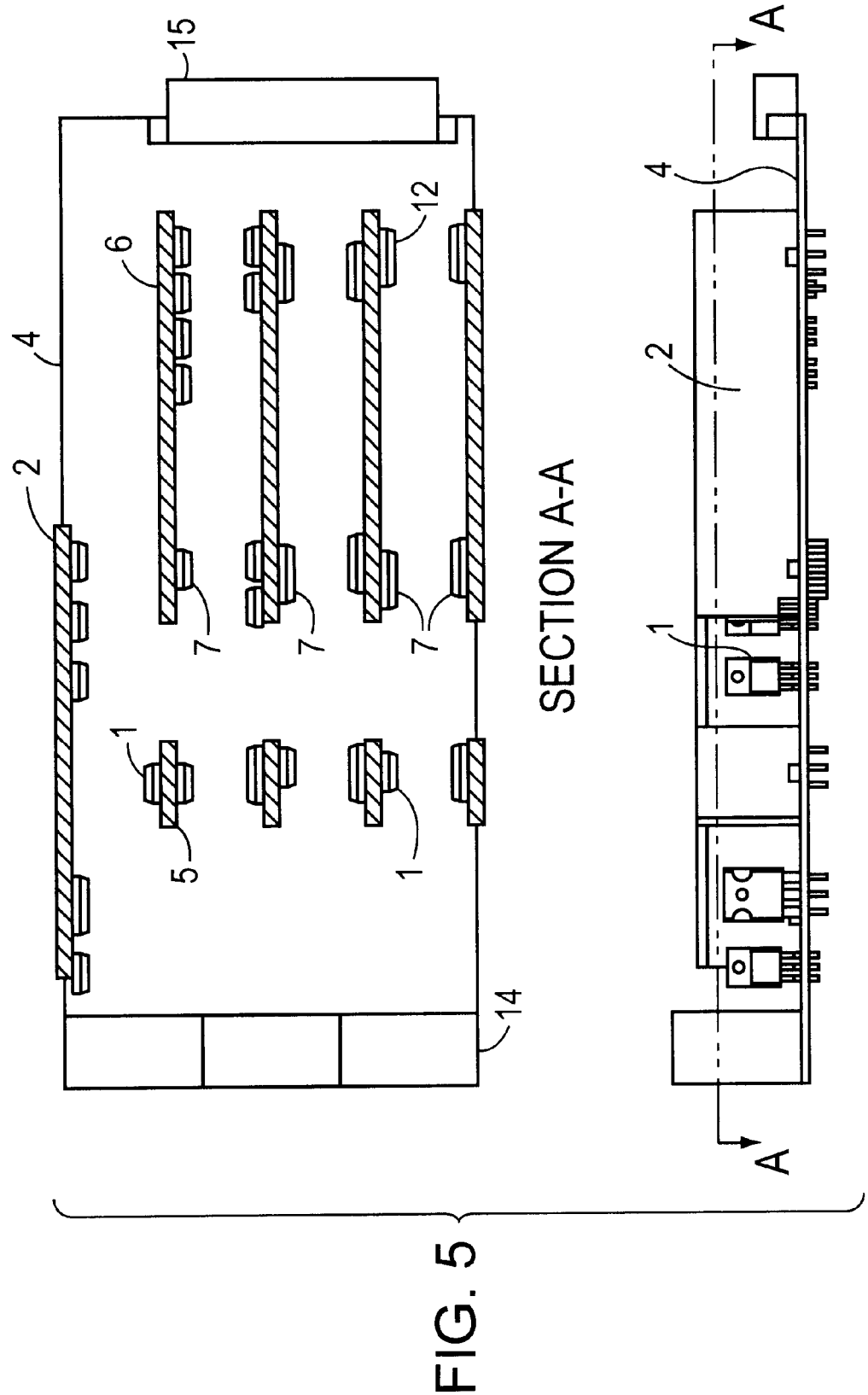

FIG. 4 depicts a multiple number of thermal bars 2, 5 and 6 of different lengths as they might be arranged in a preferred embodiment. FIG. 5 shows a sectioned view along the A—A. This view shows the thermal bars with mounted power semiconductors and the thermal bar assemblies mounted to a PCB 4. An assembly of three fans 14 is arranged to force air through the channels created by the thermal bars, the enclosure and the PCB. Power semiconductors with the highest cooling needs are mounted to the shorter thermal bars 5 that are positioned nearest the fan to allow the coolest, most turbulent air to cool the components with the highest cooling need. Multiple power semiconductors 7 and 12, with lower cooling needs, are placed farther down the air flow path on the thermal bars 6. The farther down the air flow path the lower the cooling needs of the devices.

At the fan 14 (air intake) end, the air is cooler and more turbulent. At the air exit 6, the air is hotter and only slightly turbulent. The power semiconductors affixed to the shorter bars, such as 2, 5 and 6 in a typical embodiment, are MOSFETs, while those, such as 7 or 12, are single junction rectifiers, typically referred to as ORing diodes. These diodes, in a typical embodiment, are not used as AC rectifiers, but rather are used as output isolation diodes. Such isolation diodes are usually employed when two or more power supplies have their respective outputs converted in parallel for applications requiring redundancy. Those skilled in the art are familiar with the considerations involved with redundant power systems.

Still in reference to FIG. 5, the power semiconductors 7 up to 12 are attached along the length of the bars 6. These semiconductors are, in a typical embodiment, rectifiers, used for switching high frequency AC voltages, and consequently are subjected to reverse voltage stress. It is known that higher temperatures increase their reverse leakage of such rectifiers and degrade circuit performance. MOSFET devices are a multi-junction component with a more complex structure and are, thus, more sensitive to damage or undesirable anomalous operation in the presence of higher temperatures. For example, an ORing diode such as 12, might withstand temperatures of 150–160 degrees C., while a MOSFET, although theoretically capable of 150 degrees C., can have degraded operational parameters at such high temperatures. Typical designs might limit the highest junction temperature of the MOSFETs, under normal operating conditions, to be in the 110 C. to 125 C. range.

The preceding factors indicate that, moving from right to left (from air exit back is to air inlet) in FIG. 5, the power semiconductors are mounted in order as their temperature vulnerabilities (which is a function of the circuit design) increase. Since the air temperature increases and the air turbulence decreases from left to right, the power semiconductors can be arranged so that, regardless of the actual temperatures and temperature ratings of the devices, the devices are operating with substantially similar safety margins.

Figure 11:
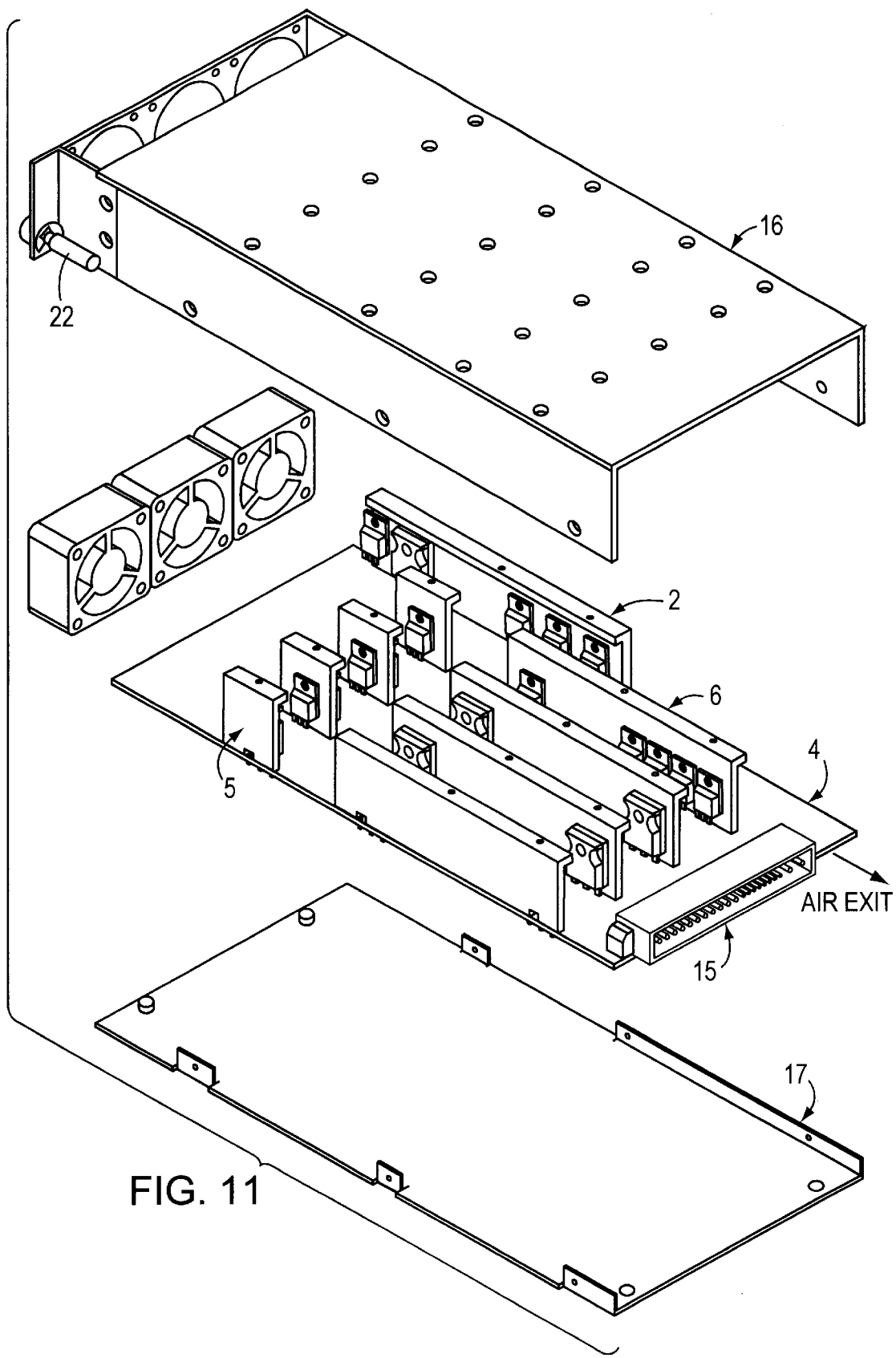
FIG. 11 is an exploded view of major assemblies of a power supply.
Figure 12:
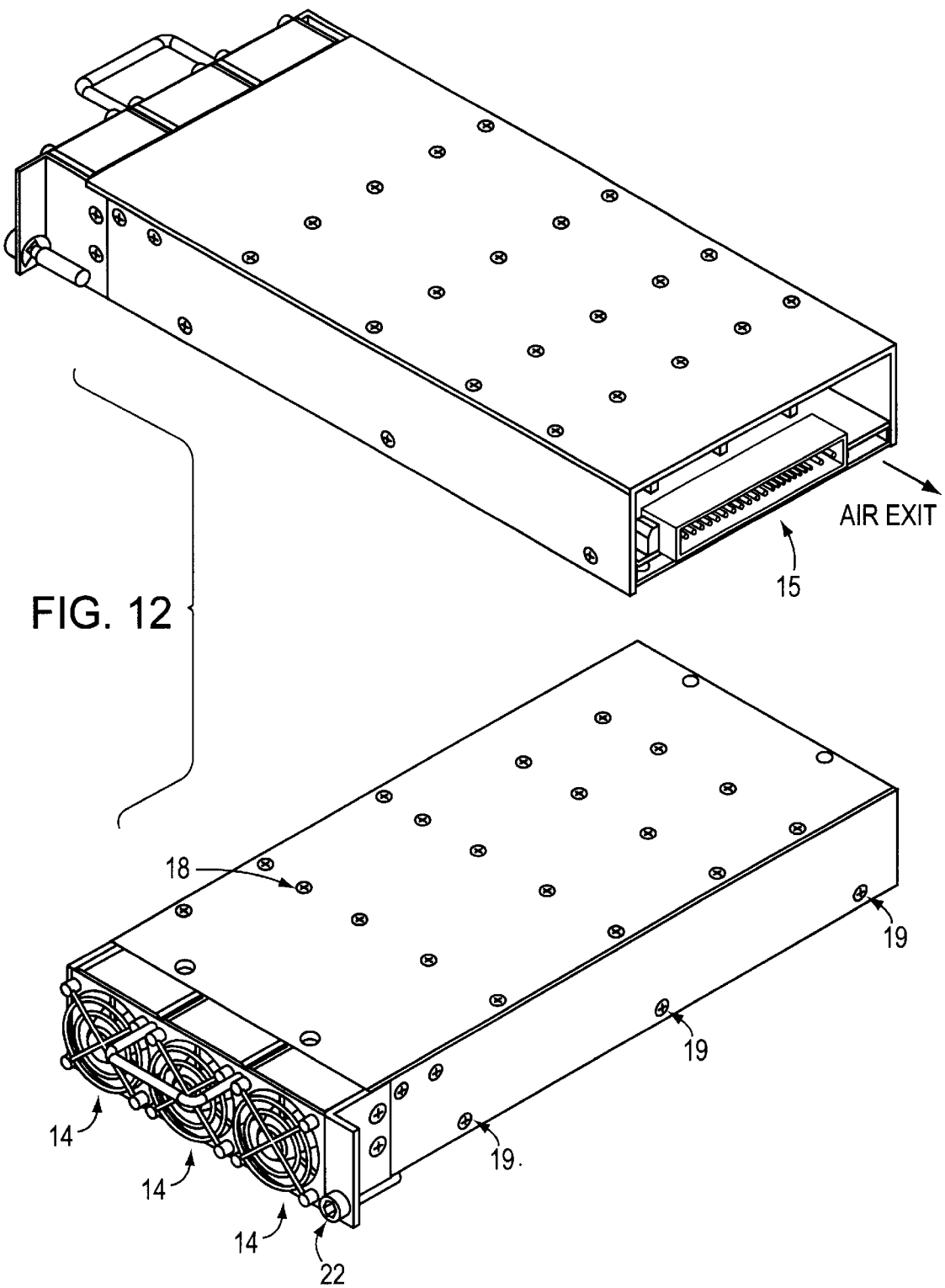
FIG. 12 is an isometric view of a power supply from two different angles.

Still referencing FIG. 5, the lower edges of the bars are in a fixed position relative to the PC board 4. Hence, the bar assembly forms a rigid member between the PC board and the enclosure ceiling 3 (FIG. 3). Heat is conducted from the metal tab of the power device through the bars to the ceiling of the enclosure. The enclosure inner surface, together with the bar assemblies and the PC board 4, form channels for the air flow generated by end mounted fans 14. FIGS. 11 and 12 together indicate, from a power semiconductor thermal management standpoint, the major heat dissipating devices, fans, bars, and air flow channels.

Figure 6:
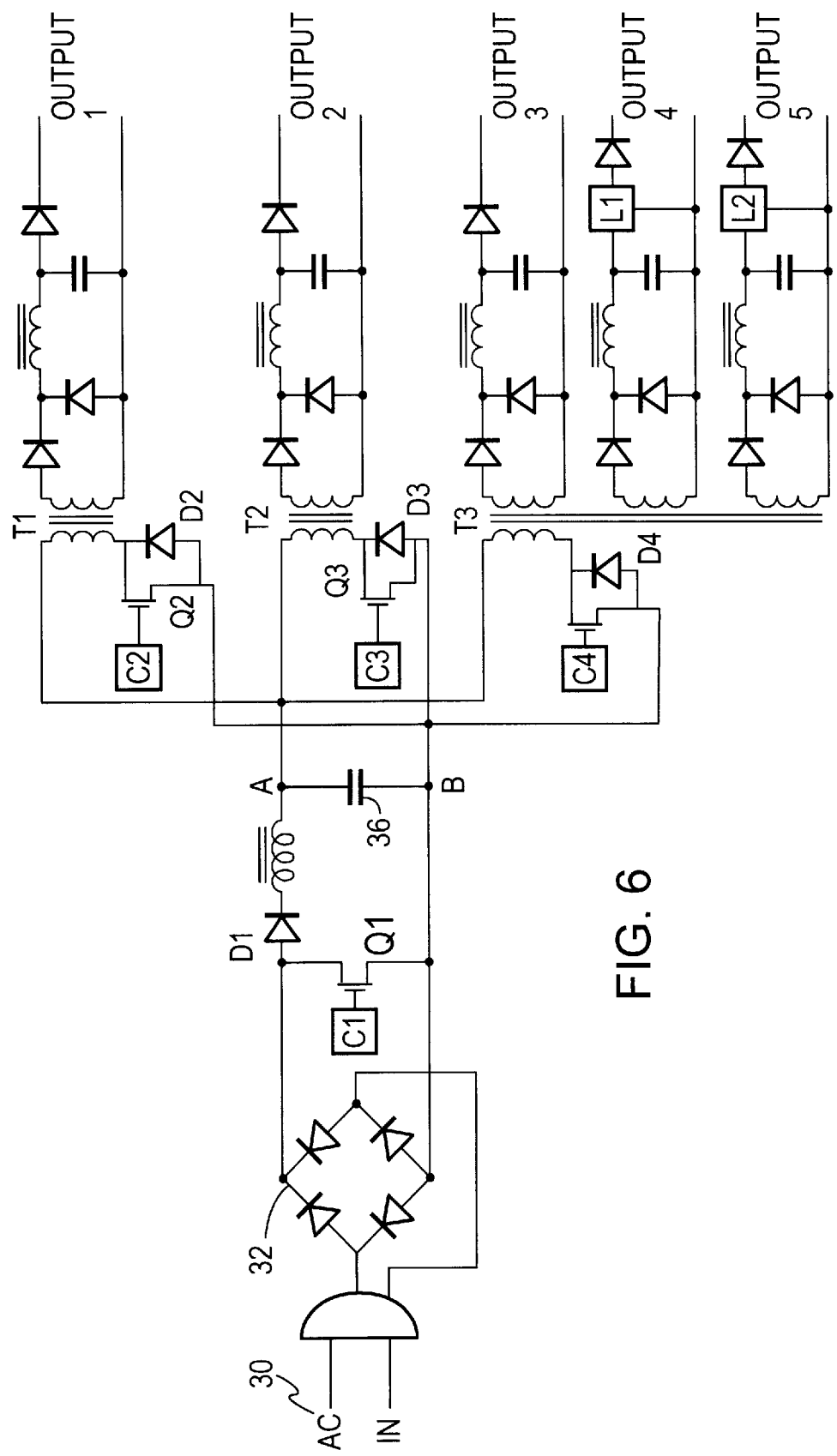
FIG. 6 is a representative schematic of a switching power supply.

FIG. 6 is a simplified drawing of typical power supply circuitry that would benefit from the present inventive heat distributing and removal system. The components and the particular design of this parts of the circuitry are well known in the art. The AC or mains input 30 is rectified by the full wave diode bridge 32 with the raw DC presented to a simple switching circuit made up of a metal oxide semiconductor field effect transistor (MOSFET) Q1, diode D1 and a filter choke and capacitor 36. The gate of the MOSFET is driven by a switching control circuit C1. The DC signal across A-B is presented to three transformers T1, T2 and T3. The return path to the B connection from each of these transformers travels through MOSFETs, Q2, Q3, and Q3, each with a diode D2, D3 and D4 that protect the MOSFETs from voltage breakdown by limiting the voltage spikes when the current through the transformer changes. The gates of these MOSFETs are driven by switching control circuits, C2, C3, and C4. The control circuits, among other purposes, cause Outputs 1, 2 and 3 to be precisely regulated. Again all these circuit components and the circuit designs are well known in the field. The secondary voltages of each of the three transformers are rectified and passed through inductor/capacitor filters and ORing diodes associated with Outputs 1 and 2. Transformer T3 has three secondaries with rectifiers and inductor/capacitor filters. Outputs 3, 4 and 5 each have an ORing diode, and outputs 4 and 4 have linear regulators L1 and L2, prior to the ORing diodes, that drop the raw DC to a lower more precisely regulated output voltage.

In a perfect configuration, 100% of the heat from the power devices would be transferred to the moving air. As a practical matter, that is not achievable. As noted in the referenced article above, the thermal resistances from the internal semiconductor junctions to the final ambient heat sink can be minimized by thermal design. The cross section, length and width of the bars serve to spread the heat from the devices along the bars' lengths so that there is minimum thermal resistance from any device up to the right angle section of the bars shown in FIG. 3. The width of the right angle section further spreads the heat so as to present maximum surface area to the ceiling interface 3 and to metallic heat conductive ceiling.

With many power devices and bars, heat is being transferred to the ceiling in many places, but in a planned, distributed matrix fashion. The importance of this is illustrated by the following conceptual examples.

Figure 7:
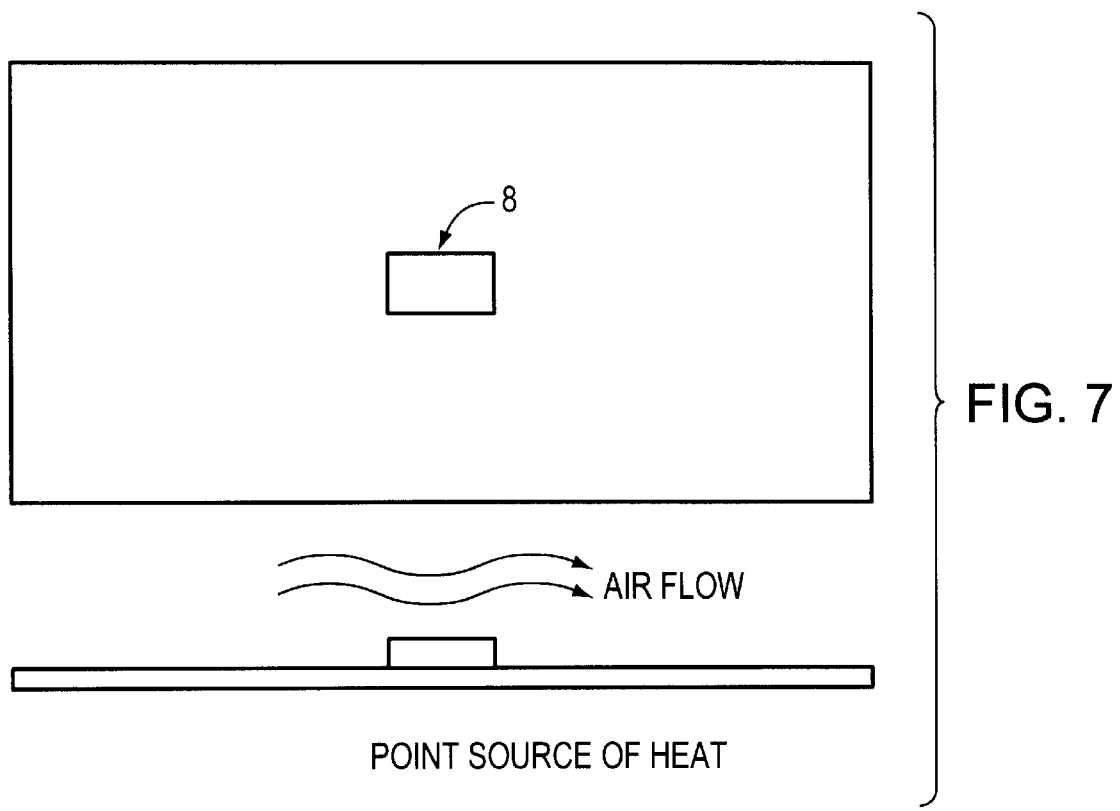
FIG. 7 is diagrammatic drawing of a single point dissipative component.

If only one device 8, as in FIG. 7, were to disspiate all the heat and the heat is conducted through to the ceiling in one place, the following analysis applies. The thermal interface between the power device and the ceiling would have to be near perfect, without any insulating medium or micro voids. For example, if a power semiconductor device, as is often found TO-220 and TO-247 packages, is run near its typical power ratings, a thermal resistance less than 0.01 degrees C. per watt would be required to keep it operating at a reasonable junction temperature. This is not achievable in practical designs. Moreover, there would be thermal gradients within the ceiling and the heat removal by the passing air would be less effective the farther the distance from the hot spot. Air passing over the surface a distance from the hot spot of the enclosure might very well exit the enclosure at virtually the same temperature as the inlet air.

Figure 8:
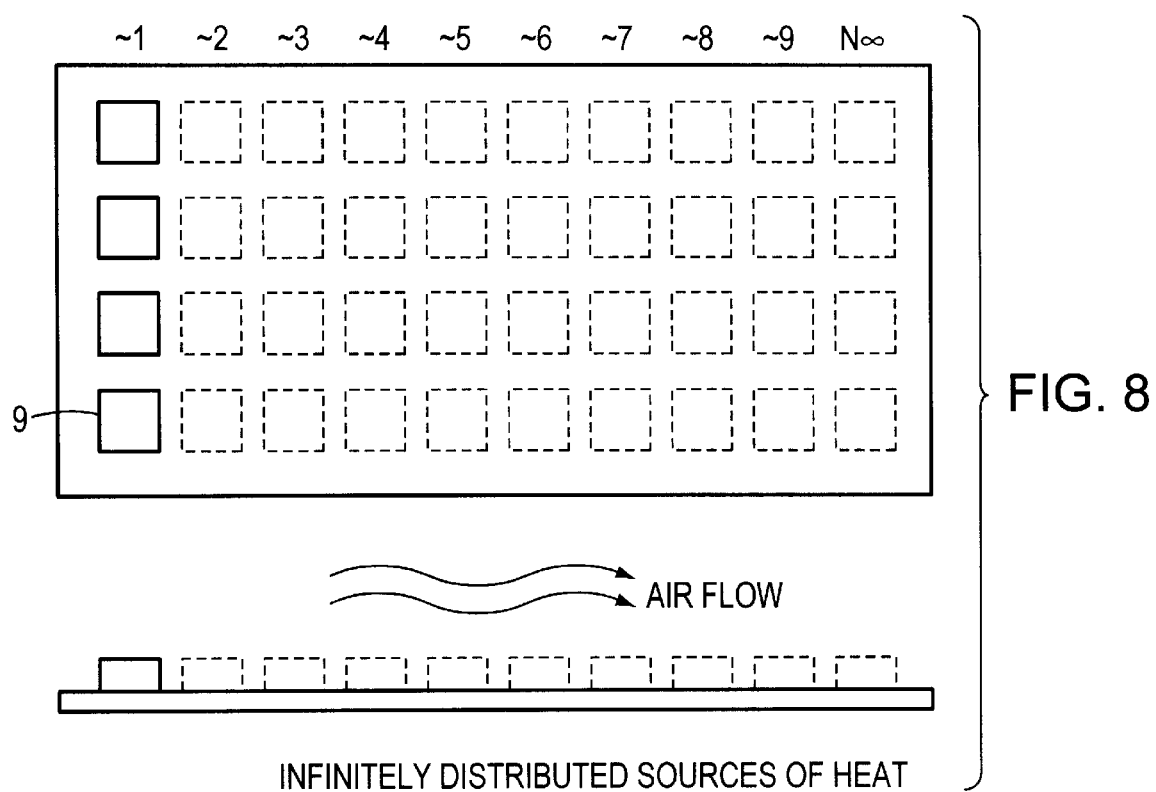
FIG. 8 is a diagrammatic view of a distributed assembly of heat dissipative components.

FIG. 8 shows an opposite design where there are an infinite number of small power devices 9 transferring heat to the ceiling. There would be no thermal gradient in the ceiling and the entire surface would be evenly heated. In this condition, virtually all the cooling air flow is effective for cooling the assembly.

Such a system as in FIG. 8 would be near perfect and the exiting air would be uniformly warmer than the inlet air and very close to the enclosure temperature. With such effective heat removal, the enclosure, bars and power devices would be cooler.

Although perfection is not achievable, it is possible to derive techniques from the principles just noted. It is the intent of the proposed embodiment to spread the heat at every opportunity, to create a system of evenly distributed point sources of heat so as to minimize enclosure thermal gradients, and, in turn, to facilitate a highly effective heat removal by the moving air.

A preferred embodiment of the present invention maintains a substantially even temperature throughout a power supply, even when an individual power semiconductor dissipates much more power than the others. A device, operating at full power, in effect, borrows cooling capacity from another device which is operating at low power. This can be particularly important in a multi output power supply where it is desired to operate any particular output at high power while the other outputs are not.

In a preferred embodiment and as discussed above, the more thermally sensitive semiconductors are the power transistors that are typically mounted near the fans. Consequently, the power semiconductor and the enclosure ceiling experience greater turbulence than power semiconductors and ceiling near the air flow exit. In addition to the normal convection cooling associated with moving air, turbulence causes what is called "impulse" or "impingement" cooling. Those skilled in the art of attaching fins and bars to microporcessor packages are familiar with such impulse cooling techniques.

This additional cooling mechanism causes the bars and ceiling at the fan end to run somewhat cooler—exactly as desired in view of the greater temperature sensitivity of those devices. The rectifiers, being closer to the exit end, tend to have temperature characteristics that are much less susceptible to thermal runaway or high temperature performance anomalies. These less sensitive devices are being cooled by air already heated by the upstream devices.

The predetermined design and mounting of the thermal bars create a predictable, well characterized thermal link from the internal semiconductor itself through to its package, to the thermal bar, and to the ceiling. Such characterization allows the temperature of any specific power device junction to be verified by an outside surface temperature measurement, as discussed below.

Figure 9:
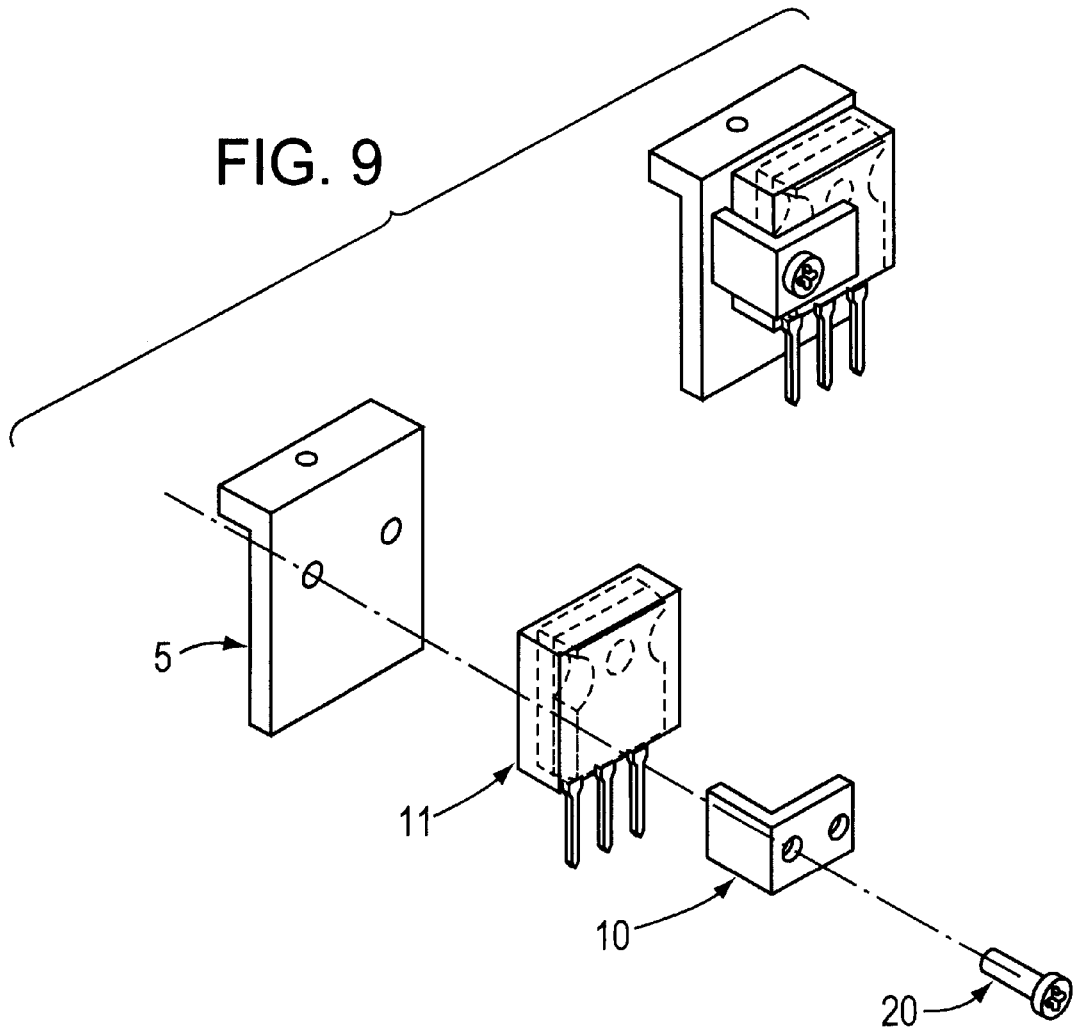
FIG. 9 is a completed and an exploded view of a single heat dissipative component assembled to a heat sink bar.
Figure 10:
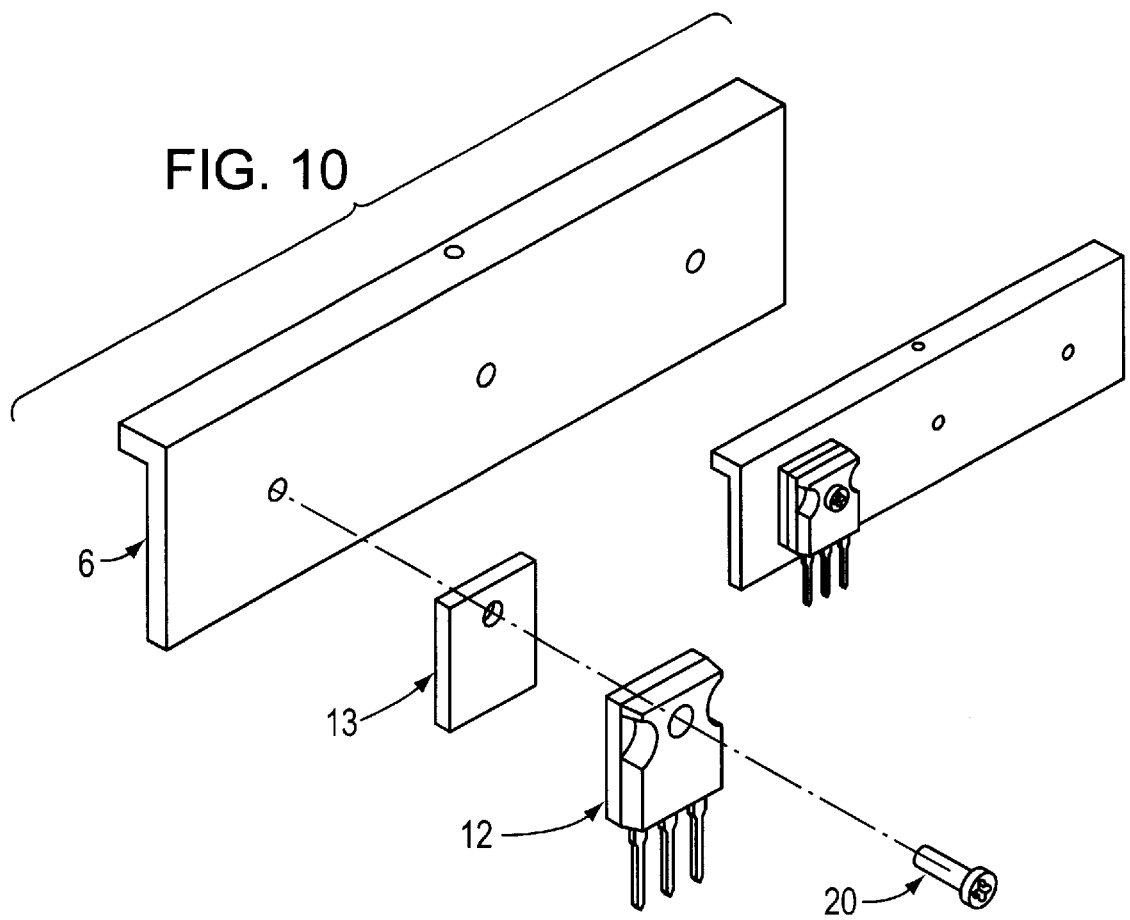
FIG. 10 is another completed and exploded view of a heat dissipative component as assembled to a heat sink bar.

FIG. 9 shows a method of attaching a power semiconductor, with a clip 10 and screw 20, to the metal cooling bar while maintaining electrical isolation, with an insulating "boot" 11. The boot is used for devices on the high-voltage, primary-side of the transformer. This boot ensures an acceptable creepage distance (an Underwriter Laboratory term) between the clip and the device and between the device and the metallic thermal bar. FIG. 10 shows an attachment with a more conventional insulator 13 without the need for a boot. FIG. 10 is used on the lower voltage secondary side. Such designs are normally made to meet the requirements of safety agencies such as Underwriters Laboratories.

After the power devices are affixed to the thermal bars, the bar assemblies are treated as components and soldered into the PC board.

FIG. 11 shows an individual power supply enclosure, with the mounted semiconductors, thermal bars, PC board, an enclosure top, sides and bottom just before completing the assembly. FIG. 12 shows the completed assembly. The cover 16 is dropped over the tops of the thermal bars, 2, 5 and 6 and attached by screws 18. The cover is then also attached to the base 17, by screws 19.

As mentioned above, since each of the principle thermal resistance and interfaces (semiconductor junction to package tab, tab-to-thermal bar, thermal bar lateral thermal gradients, thermal bar-to-enclosure and to moving air and enclosure to outside air) is very specifically known or characterized, the junction temperature of any semiconductor can be determined by measuring the temperature of the thermal bar attachment screw.

In FIG. 11, there are nine thermal bars. The circuit and hence the thermal design often are arranged with the bars 5 on the primary side of the circuit and have power MOSFET transistors and power diodes attached. Bars 6 are on the secondary side and have rectifier diodes, isolation diodes (ORing diodes, as in FIG. 6), and power regulators attached. Bar 2 has input bridge rectifiers and power factor correction semiconductors attached. A jack screw 22 is attached to a lateral extension of the front panel of the power supply. This jack screw engages a corresponding receiving slot in the frame (not shown) to which the power supply is to be mounted. The jack screw, as known in the art, has a thread that mates with a receiving thread in the frame. The design provides a mechanical advantage to overcome the insertion force of the rear connector 15. With the jack screw, the power supply is easily inserted or removed by the user.

Figure 13:
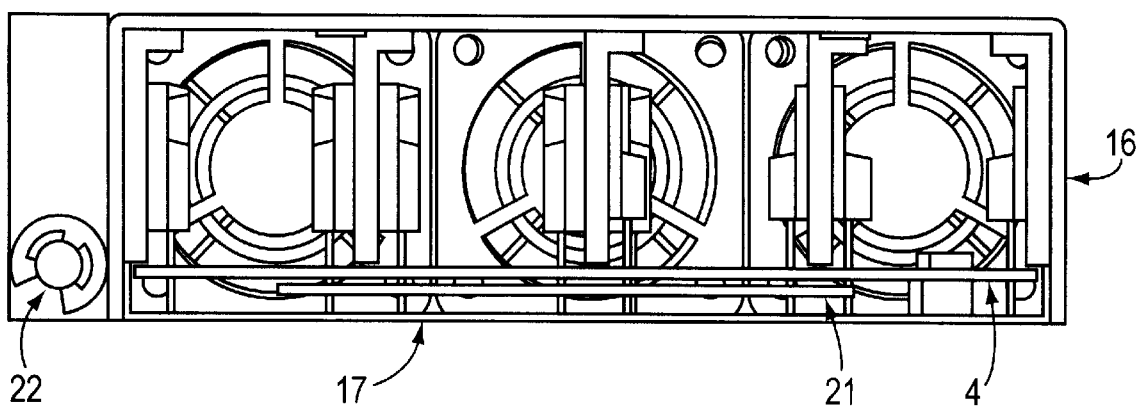
FIG. 13 is an opposite end view of the fans of a power supply.

FIG. 13 is an end view of the power supply of FIG. 12 from the air exit end. The main power PC board 4 and a second PC board 21 immediately under it contain most of the control circuitry for the entire unit.

Virtually all air flow provided by the fans is over the top of the main PC board, along the thermal bars acting as heat dissipation fins, and the inside ceiling of the enclosure. Although the thermal bars and ceiling surface are the largest surfaces areas accessible by the air flow, the nature of the component layout is designed to channel specific air volume across the power transformers and power chokes, including the power factor choke. The rear of the fans 14 can be seen through the unit. FIGS. 12 and 13 show a jack screw 22 that serves as a very compact ejector mechanism as discussed above.

Figure 14:
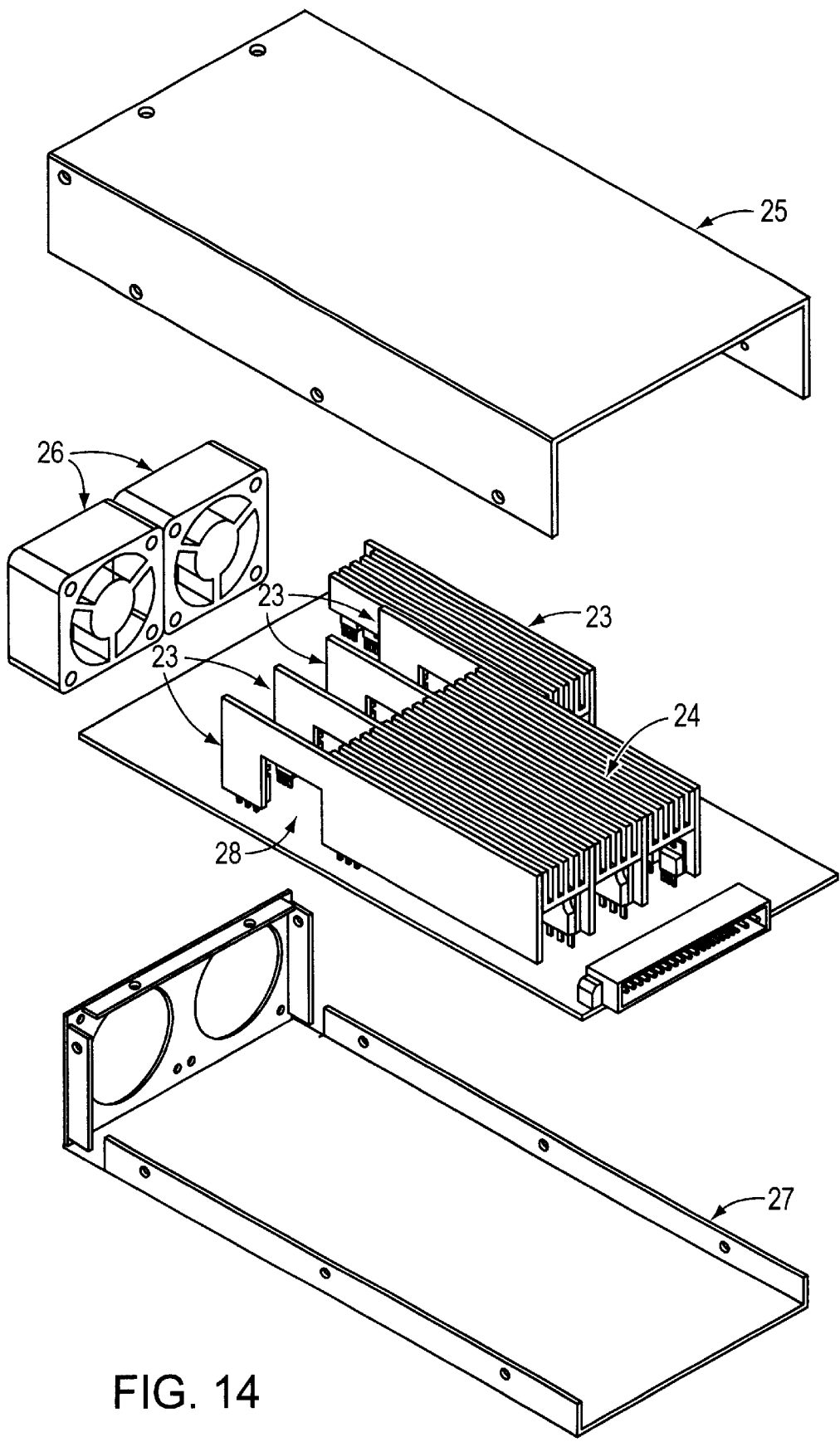
FIG. 14 is an exploded view of another power supply assembly.

FIG. 14 shows another embodiment, having two fan, in which heat is transferred from thermal bars 23, not to the outer cover 25, but rather to an array of cooling fins 24 that are assembled as a single, L-shaped block. Fans 26 force air over the fins. With this arrangement, the printed circuit board and all electronic components are configured as in FIG. 11 except that the thermal bars are flat vertical pieces instead of right angled. The cutouts 28, as do the gaps in FIG. 11, provide positions for the power supply transformers. The base 27 and taller cover accommodate added height of the fins. This arrangement allows substantially more power to be dissipated than does the lower profile, non-finned arrangement of FIG. 12.

What is claimed is:

1. An electronic switching power supply comprising:
   a power input,
   at least one DC power output,
   components including rectifiers, transistors, transformers, inductors and capacitors, and switching electronics arranged to accept the power input and convert the power input into the at least one DC power output and wherein said components are disposed sequentially according to their cooling needs from highest to lowest,
   at least one printed circuit board for making electrical connections at least to those power dissipating components,
   at least one thermally conductive bar to which the components requiring cooling are mounted in thermal contact, wherein the placement of the components along the at least one thermally conductive bar is according to their cooling needs,
   an enclosure with an air inlet port and an air outlet port, the enclosure placed surrounding and making thermal contact with the at least one conductive bar and its mounted components and the at least one printed circuit board, wherein the enclosure, printed circuit board and conductive bar define at least one air path channel,
   at least one fan mounted to force air along the at least one air path channel from the air inlet port to the air outlet port and wherein the end of the thermally conductive bar is positioned along the air flow channel with the components with the highest cooling requirements nearest the at least one fan.

2. The electronic switching power supply as defined in claim 1 wherein said components, as determined from the specifications for the components and the power supply, are sequentially disposed according to their cooling needs from highest to lowest, wherein their cooling needs include determining the heat vulnerability safety margins of the components and wherein the components are disposed sequentially according to their safety margins, and not to their actual temperatures.

3. The electronic switching power supply as defined in claim 2 wherein the placing of the components provides components that are operating with similar safety margins.

4. The electronic switching power supply as defined in claim 1 wherein the enclosure is a thermally conductive material that is physically joined to the at least one thermally conductive bar along the length of the bar, and wherein the temperatures along the enclosure proximate to the bar are related to the temperatures of the attached components.

5. The electronic switching power supply as defined in claim 1 further comprising means for arranging the attached components with respect to the air inlet so that turbulence effects occur adjacent to the surfaces of the components to reduce thermal resistance from the component to the air.

* * * * *